(12) United States Patent
Pu et al.

(10) Patent No.: US 10,788,513 B2
(45) Date of Patent: Sep. 29, 2020

(54) TEST DEVICE AND TEST METHOD

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Xun Pu, Beijing (CN); Hongmin Li, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 44 days.

(21) Appl. No.: 15/962,110

(22) Filed: Apr. 25, 2018

(65) Prior Publication Data
US 2019/0064217 A1   Feb. 28, 2019

(30) Foreign Application Priority Data
Aug. 23, 2017   (CN) .......................... 2017 1 0731637

(51) Int. Cl.
G01R 1/073 (2006.01)
G09G 3/00 (2006.01)
G01R 1/067 (2006.01)

(52) U.S. Cl.
CPC ..... G01R 1/07314 (2013.01); G01R 1/06722 (2013.01); G09G 3/006 (2013.01)

(58) Field of Classification Search
CPC ........... G01R 1/073; G01R 1/067; G09G 3/00
USPC .... 324/755.05–755.08, 500, 754.23, 750.15, 324/754.01–755.01, 755.11, 756.03, 324/758.01
See application file for complete search history.

(56) References Cited

U.S. PATENT DOCUMENTS

2013/0169300 A1* 7/2013 Ishikawa ............ G01R 31/2891
                                                          324/750.22
2017/0074940 A1* 3/2017 Li ...................... G01R 31/2808

FOREIGN PATENT DOCUMENTS

CN          202256602 U     5/2012

OTHER PUBLICATIONS

First Office Action for Chinese Patent Application No. 201710731637.1 dated Dec. 26, 2019.

* cited by examiner

Primary Examiner — Melissa J Koval
Assistant Examiner — Trung Nguyen
(74) Attorney, Agent, or Firm — Calfee, Halter & Griswold LLP

(57) ABSTRACT

A test device and a test method are provided. The test device can comprise a movable probe platform, a plurality of signal access points, and a plurality of test probes fixed on the movable probe platform. Each of the plurality of signal access points is correspondingly coupled to one test probe for accessing a corresponding test signal. The plurality of the test probes are configured to contact with test pads on a panel to be tested, and to transmit test signals accessed from the plurality of the signal access points to the test pads, so as to perform an electrical test to the panel to be tested.

13 Claims, 3 Drawing Sheets

TEST DEVICE AND TEST METHOD

CROSS REFERENCE OF RELATED APPLICATION

The present application claims the priority of the Chinese patent application No. 201710731637.1 filed on Aug. 23, 2017, which is entirely incorporated herein by reference.

TECHNICAL FIELD

This disclosure relates to the field of display technology, particularly to a test device and a test method.

BACKGROUND

In the process flow of manufacturing of a liquid crystal display, a whole piece of motherboard is generally sliced after the cell alignment is finished, so as to form a plurality of independent display panels. In order to monitor product quality, ET test, i.e., an electrical test has to be performed to the display panels formed after slicing.

The traditional ET test designs some test pads on a panel to be tested, and then designs a set of test tools for the panel to be tested, so as to perform an electrical test to the panel to be tested through the test tools, thereby determining whether the panel to be tested is normal.

However, due to inconsistent designs of different panels to be tested, test devices for them are different at present. For a panel to be tested in a GOA (Gate Driver On Array) mode and a panel to be tested in a non-GOA mode, the number of test pads of test devices and the order of test signals for them are different. Therefore, the test devices for them cannot be shared. Further, for two panels to be tested both in GOA mode, because types of the test signals thereof are also different, test devices for the two cannot be shared either. A set of test devices have to be designed independently for each type of panels to be tested in the prior art, which results in substantial increase of cost of the whole process flow.

SUMMARY

This disclosure provides a test device and a test method for solving the existing problem that a set of test devices have to be designed independently for each type of panels to be tested to perform an electrical test.

In order to solve the above problem, this disclosure provides a test device. The test device can comprise: a movable probe platform, a plurality of signal access points, and a plurality of test probes fixed on the movable probe platform. Each signal access point can be correspondingly coupled to one test probe for accessing a corresponding test signal. The plurality of the test probes are configured to contact with test pads on a panel to be tested, and to transmit test signals accessed from the plurality of signal access points to the test pads, so as to perform an electrical test to the panel to be tested.

In some exemplary embodiments, the test device can further comprise a first frame, a second frame, and a support for supporting the first frame and the second frame. The first frame is used for bearing the panel to be tested, and the second frame is used for bearing the movable probe platform.

In some exemplary embodiments, the support can be a support with an adjustable height.

In some exemplary embodiments, the plurality of the test probes can be double row test probes in an equidistant arrangement.

In some exemplary embodiments, a number of the plurality of the test probes can be greater than or equal to 15.

In some exemplary embodiments, the plurality of the test probes can be scalable test probes. The scalable test probe can comprise a housing, a probe head, and an elastic component for changing a relative position of the housing and the probe head.

In some exemplary embodiments, the elastic component can comprise a control unit, and a spring coupled to one end of the control unit. The spring is arranged at a side of the probe head away from the panel to be tested, and the control unit is arranged at a side of the spring away from the probe head. When the spring is deformed by a pressure of the control unit, the control unit controls the probe head to protrude from the housing and to contact with a test pad on the panel to be tested. When the pressure is revoked, the spring recovers to an initial state, and the control unit controls the probe head to retract into the housing.

In some exemplary embodiments, a size of the probe head can be smaller than a size of the test pad.

In some exemplary embodiments, the test device can further comprise an alignment unit fixed on the movable probe platform. The alignment unit can be used for performing an alignment with an alignment mark on the panel to be tested.

In some exemplary embodiments, the alignment unit can be a CCD (Charge Coupled Device) alignment camera.

In order to solve the above problem, this disclosure further discloses a test method. The test method can comprise: controlling a plurality of signal access points to access corresponding test signals; and controlling a plurality of corresponding test probes to contact with test pads on a panel to be tested, transmitting the test signals to the test pads, so as to perform an electrical test to the panel to be tested. The plurality of test probes are fixed on a movable probe platform, and each signal access point is correspondingly coupled to one test probe.

In some exemplary embodiments, the test method can further comprise: prior to the controlling a plurality of signal access points to access corresponding test signals, controlling an alignment unit to perform an alignment with an alignment mark on the panel to be tested. The alignment unit is fixed on the movable probe platform. In some exemplary embodiments, the controlling a plurality of signal access points to access corresponding test signals can comprise: selecting a corresponding number of signal access points based on a number of test pads on the panel to be tested; determining a type and an order of test signals accessed from the corresponding number of the signal access points based on a type and an order of test signals required by the panel to be tested; and controlling the corresponding number of the selected signal access points to access corresponding test signals based on the determined type and order of the test signals.

In some exemplary embodiments, the controlling a plurality of corresponding test probes to contact with test pads on a panel to be tested comprises adjusting a height of a support, so as to enable the plurality of the corresponding test probes to contact with the test pads on the panel to be tested. The support is used for supporting a first frame and a second frame, the first frame is used for bearing the panel to be tested, and the second frame is used for bearing the movable probe platform.

EMBODIMENTS

In order to enable the above objects, characteristics and advantages of this disclosure to be more clear and easy to understand, this disclosure will be further explained below in details in conjunction with the drawings and the embodiments.

Figure 1:
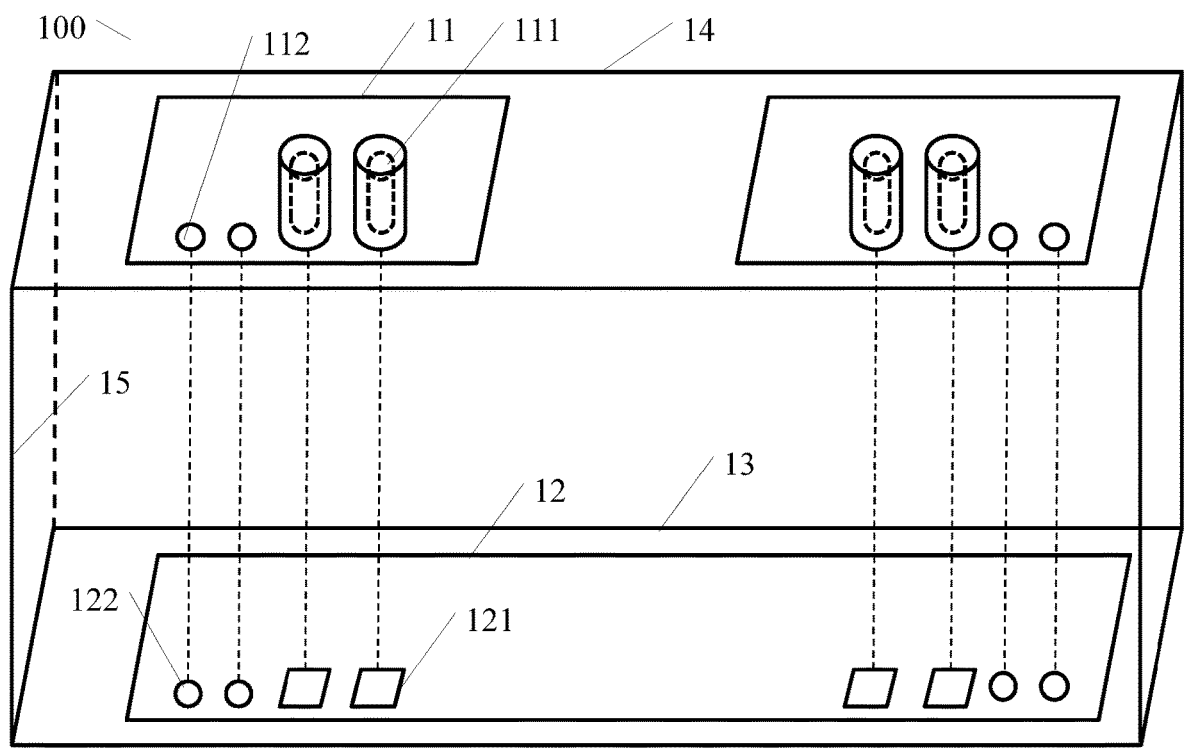
FIG. 1 shows a structural schematic diagram of a test device provided by an embodiment of this disclosure.

FIG. 1 shows a structural schematic diagram of a test device 100 provided by an embodiment of this disclosure.

As shown in FIG. 1, the test device 100 comprises: a movable probe platform 11, a plurality of signal access points (not shown in FIG. 1), and a plurality of test probes 111 fixed on the movable probe platform 11. Each signal access point is correspondingly coupled to one test probe 111 for accessing a corresponding test signal. The test probe 111 is configured to contact with a test pad 121 on a panel 12 to be tested, and to transmit the test signal accessed from the signal access point to the test pad 121, so as to perform an electrical test to the panel to be tested.

The signal access points can be located on the probe platform 11 and can also be located outside the probe platform. The signal access points and the test probes are in one-to-one correspondence and coupled to each other unchangeably. By controlling movement of the movable probe platform 11, the test probes 111 can accurately contact with the test pads 121 on the panel 12 to be tested.

By inputting to signal access points corresponding test signals, the test probes 111 unchangeably coupled to the signal access points receive the test signals, so that when the test probe 111s contact with the test pads 121 on the panel 12 to be tested, the test signals are transmitted to the test pads 121 so as to perform an electrical test to the panel 12 to be tested.

As shown in FIG. 1, the test device 100 can further comprise a first frame 13, a second frame 14, and a support 15 for supporting the first frame 13 and the second frame 14. The first frame 13 can be used for bearing one or more panels 12 to be tested, and the second frame 14 can be used for bearing one or more movable probe platforms 11.

The support 15 is a support with an adjustable height. When it is not required to perform an electrical test to the test pads 121 on the panel 12 to be tested, the height of the support 15 can be adjusted, so as to enable a distance between the first frame 13 and the second frame 14 to be increased, thereby enabling the test probes 111 not to contact with the test pads 121. When it is required to perform an electrical test to the test pads 121 on the panel 12 to be tested, the height of the support 15 can be adjusted, so as to enable the test probes 111 to contact with the test pads 121.

In some exemplary embodiments, the test device 100 can further comprise an alignment unit 112 fixed on the movable probe platform 11. The alignment unit 112 is used for performing an alignment with an alignment mark 122 on the panel 12 to be tested.

In some exemplary embodiments, the alignment mark 122 is arranged on the panel 12 to be tested. In the event that the alignment unit 112 is arranged on the movable probe platform 11, if a distance between the alignment mark 122 and a test pad 121 that is closest to the alignment mark 122 is d1, and a distance between the alignment unit 112 and a test probe 111 that is closest to the alignment unit 112 is d2, then d1=d2.

In an embodiment of this disclosure, when an electrical test is performed, the alignment unit 112 firstly collects an offset of the alignment mark 122 relative to itself, and then controls the movable probe platform 11 to move based on the offset, so as to enable the alignment unit 112 to be aligned with the alignment mark 122. After the alignment is finished, a corresponding number of test probes 111 can be firstly selected based on a number of the test pads 121. That is to say, a corresponding number of signal access points are selected. Then, a type and an order of test signals accessed by the signal access points correspondingly coupled to the test probes 111 are determined based on a type and an order of the test signals needed by the panel 12 to be tested. Next, the test probes 111 are controlled to contact with the test pads 121, and the test signals accessed by the signal access points are transmitted to the test pads 121, so as to perform an electrical test to the panel 12 to be tested. That is to say, after one alignment is finished, an electrical test can be performed to all of test pads 121 on the panel 12 to be tested.

Because the signal access points can access corresponding test signals freely, even if types and orders of test signals of test pads of different panels to be tested that need to be tested are different, a set of test devices can also be shared to perform electrical tests. Also, because the signal access points can delete the test signals freely, even if the numbers of the test pads of different panels to be tested are different, a set of test devices can also be shared to perform electrical tests.

By the alignment unit aligning with the alignment mark, the test probes can accurately contact with the test pads, so as to implement electrical tests of different sizes of panels to be tested. In some exemplary embodiments, the alignment unit 112 can be a CCD alignment camera.

In some exemplary embodiments, the test probes 111 on the movable probe platform 11 in FIG. 1 are double row test probes in an equidistant arrangement, wherein distances between any two of adjacent test probes in each row is equal. Each row of test probes need to correspond to one alignment unit 112. According to this disclosure, the test pads 121 on the panel 12 to be tested can be arranged in a single row and also in double rows. If the test pads 121 are arranged in a single row, a number of corresponding alignment marks 122 is 1. If the test pads 121 are arranged in double rows, a number of corresponding alignment marks 122 is 2. It is noted that each test probe 111 in FIG. 1 can represent one row of test probes. Correspondingly, each test pad 121 in FIG. 1 can also represent one row of test pads.

Figure 2:
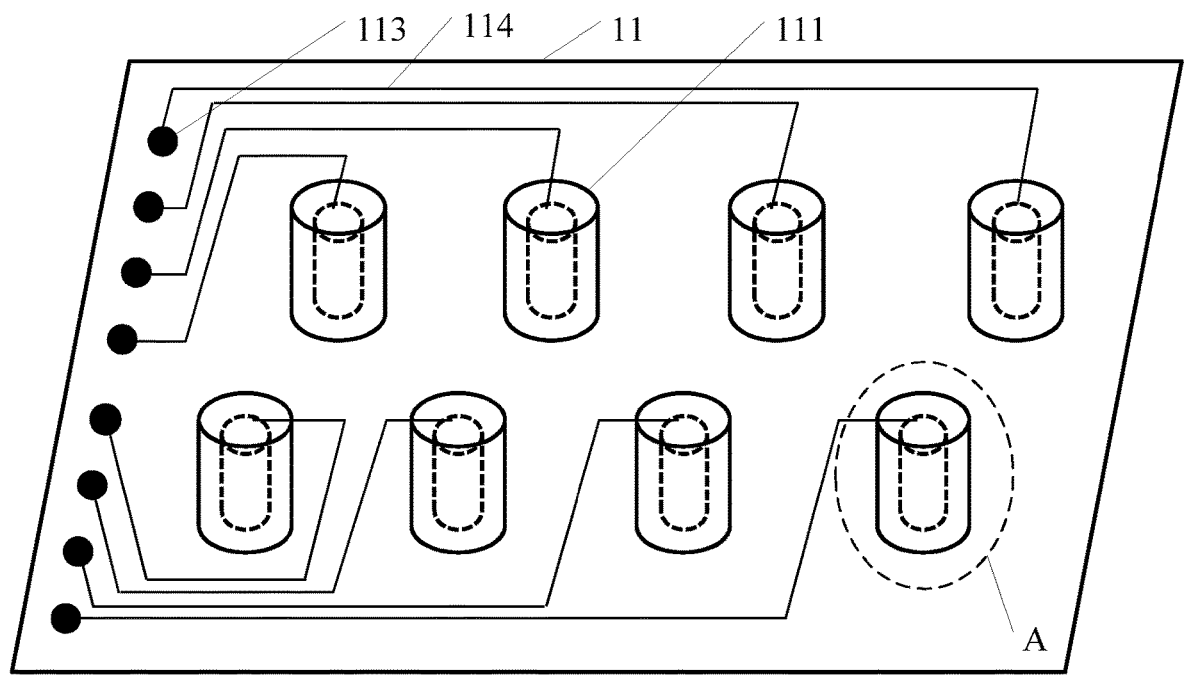
FIG. 2 shows a structural schematic diagram of a movable probe platform provided by an embodiment of this disclosure.

FIG. 2 shows a structural schematic diagram of a movable probe platform 11 provided by an embodiment of this disclosure.

As shown in FIG. 2, a plurality of test probes 111 are arranged on the movable probe platform 11. The test probes 111 are double row test probes in an equidistant arrangement, and distances between any two of adjacent test probes 111 in each row are equal. According to this disclosure, a number and an arrangement of the test probes can be set as needed. In an alternative embodiment, the test probes can be test probes in a non-equidistant arrangement.

As shown in FIG. 2, the signal access points 113 are arranged on the movable probe platform 11, and each signal access point 113 is correspondingly coupled to one test probe 111 through a wiring 114. This simplifies a structure design. In an alternative embodiment, as stated above, the signal access points 113 can be arranged outside the movable probe platform 11.

Again as shown in FIG. 2, the movable probe platform 11 is shown as including 8 test probes 111. In such a case, assume that there is a panel to be tested, on which there are only 7 test pads arranged in two rows wherein a number of test pads in the upper row is 4, a number of the test pads in the lower row is 3, and the three test pads in the lower row are close to an alignment mark. When there is a need to use the movable probe platform 11 as shown in FIG. 2 to perform an electrical test to such a panel to be tested, a test signal of a signal access point 113 coupled to a test probe 111 in e.g. region A can be discarded, and the remaining signal access points are kept to access test signals normally, so as to perform an electrical test to the panel to be tested.

At present, a lower frame of a panel to be tested becomes narrower and narrower, only a single row of test pads can be generally arranged on the panel to be tested. In this case, for the test device provided by this disclosure, any of rows of the test probes thereof can be selected to implement an electrical test, while the other row of the test probes leave unused. However, when the test pads arranged on the panel to be tested are in double rows, the double rows of test probes will be selected to implement an electrical test. Thus it can be seen that the test device according to this disclosure can perform electrical tests to different types of panels to be tested, so as to overcome a defect that it is required in the prior art to configure corresponding test devices for different types of panels to be tested respectively.

Because a number of test pads on the present panel to be tested is generally less than or equal to 15, in an embodiment of this disclosure, a number of the test probes can be greater than or equal to 15, so as to ensure that an electrical test can be performed to all of the test pads. In an alternative embodiment, a number of the test probes can be greater than 1 and less than 15.

Figure 3:
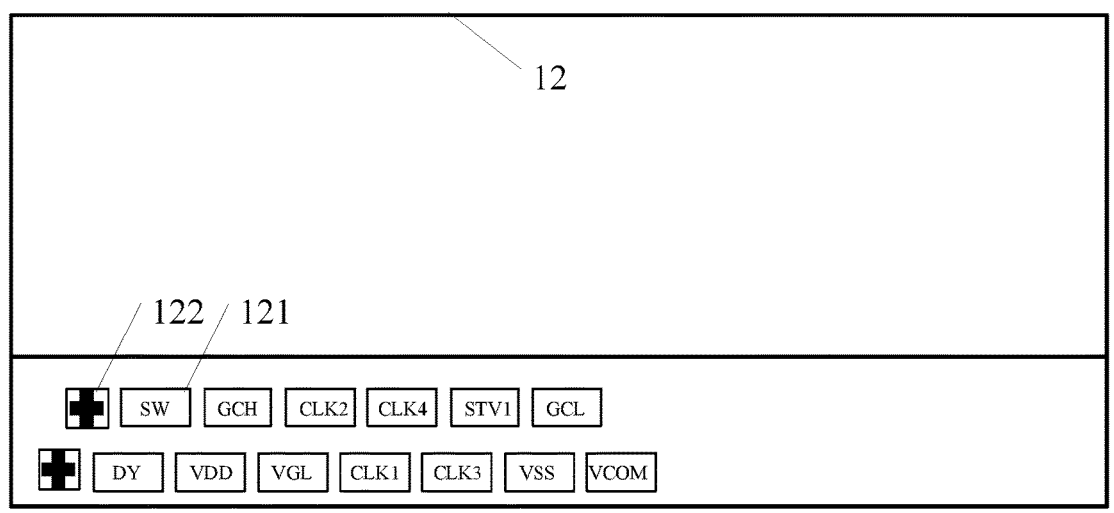
FIG. 3 shows a structural schematic diagram of a panel to be tested provided by an embodiment of this disclosure.

FIG. 3 shows a structural schematic diagram of a panel 12 to be tested provided by an embodiment of this disclosure.

In an embodiment of this disclosure, an alignment mark 122 and test pads 121 are arranged on the panel 12 to be tested. The alignment mark 122 can perform an alignment with the alignment unit on the movable probe platform, and the test pads 121 are used for receiving test signals inputted by the test probes so as to perform an electrical test to the panel 12 to be tested. As shown in FIG. 3, the test pads 121 are arranged in two rows, distances between any two of adjacent test pads in each row are equal, and sizes of each tests pad are the same. The test pads in one of the two rows can be aligned with the test pads in the other row, and can also be misaligned therewith as shown in FIG. 3. A shape of the alignment mark 122 can be a cross shape as shown in FIG. 3, and can also be set as other shapes, which will not be limited in the embodiment of this disclosure.

As shown in FIG. 3, the test pads 121 can include SW, GCH, CLK2, CLK4, STV1, GCL, DY, VDD, VGL, CLK1, CLK3, VSS, and VCOM wherein SW represents a switch signal for controlling On or Off of a thin film transistor in a panel to be tested; GCH and VDD represent different high level signals; CLK1, CLK2, CLK3 and CLK4 represent different clock signals; STV1 represents a trigger signal which is an initial signal displayed by each image; GCL, VSS and VGL represent different low level signals; DY represents a signal provided to a data line in a panel to be tested; and VCOM represents a common level signal. The above test pads represent different types of test signals respectively.

Figure 4:
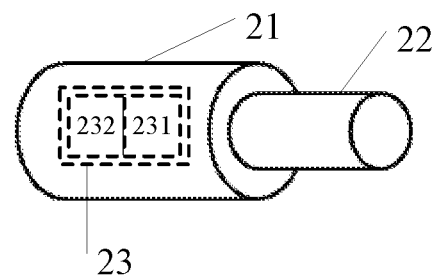
FIG. 4 shows a structural schematic diagram of a scalable test probe provided by an embodiment of this disclosure.

FIG. 4 shows a structural schematic diagram of a scalable test probe provided by an embodiment of this disclosure.

In the embodiment of this disclosure, the test probe can be a scalable test probe. The scalable test probe comprises a housing 21, a probe head 22, and an elastic component 23 for changing a relative position of the housing 21 and the probe head 22.

The elastic component 23 comprises a control unit 232 and a spring 231 coupled to one end of the control unit. The spring 231 is arranged at a side of the probe head 22 away from the panel to be tested, and the control unit 232 is arranged at a side of the spring 231 away from the probe head 22. When the spring 231 is deformed by a pressure of the control unit, the control unit 232 controls the probe head 22 to protrude from the housing 21 and to contact with a test pad on the panel to be tested. When the pressure is revoked, the spring 231 recovers to an initial state so as to control the probe head 22 to retract into the housing 21.

When there is a need to perform an electrical test to the panel to be tested, the probe head 22 is controlled to protrude from the housing 21 and to contact with the test pad on the panel to be tested. When there is no need to perform an electrical test to the panel to be tested, the probe head 22 is controlled to retract into the housing 21 and not to contact with the test pad on the panel to be tested, so as to reduce scratching to the panel to be tested that is caused by the probe head 22.

In some exemplary embodiments, a size of the probe head 22 is smaller than that of the test pad, so as to ensure that the probe head 22 can effectively contact with the test pad. The material of the probe head according to this disclosure can be a metal material.

The test device provided according to an embodiment of this disclosure comprises a plurality of signal access points, and a plurality of test probes fixed on the movable probe platform, wherein each signal access point is correspondingly coupled to one test probe for accessing a corresponding test signal. The test probe is configured to contact with a test pad on a panel to be tested, and to transmit a test signal accessed by the signal access point to the test pad, so as to perform an electrical test to the panel to be tested. The test device provided according to an embodiment of this disclosure can select a corresponding number of test probes based on numbers of test pads on different panels to be tested. When types and orders of test signals for different panels to be tested are different, the type and the order of test signals accessed by the plurality of signal access points can also be changed so as to be adapted to different panels to be tested. Thus, different types of panels to be tested can share the test device provided according to an embodiment of this disclosure to perform an electrical test, so as to reduce the cost of the process flow.

Figure 5:
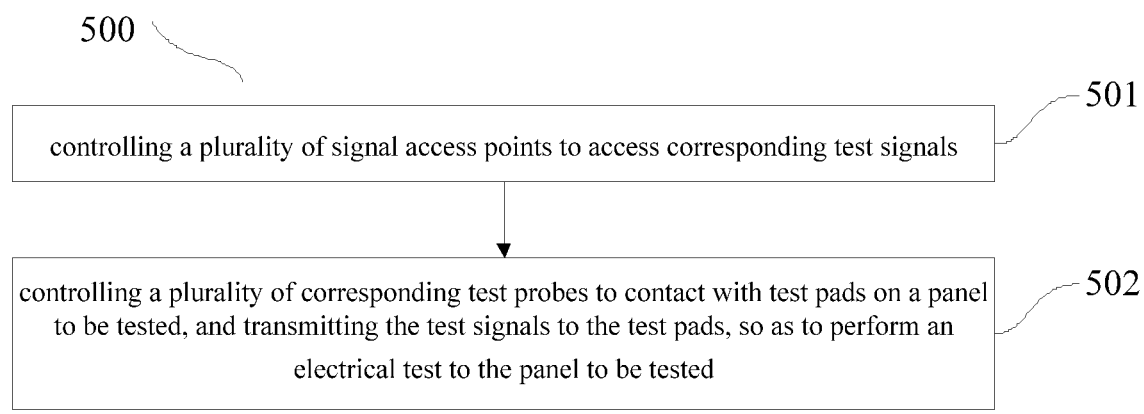
FIG. 5 shows a flow chart of a test method provided by an embodiment of this disclosure.

FIG. 5 shows a flow chart of a test method 500 of an embodiment of this disclosure. The method 500 can comprise: step 501, controlling a plurality of signal access points to access corresponding test signals.

In an embodiment of this disclosure, in order to perform an electrical test to a panel to be tested, firstly, a corresponding number of signal access points are selected based on a number of test pads on the panel to be tested, and a type and an order of test signals accessed from the signal access points are determined based on a type and an order of test signals needed by the panel to be tested. Then, a plurality of selected signal access points are controlled to access corresponding test signals based on the determined type and order of the test signals.

As stated above, the test device according to this disclosure can comprise an alignment unit. The alignment unit is fixed on the movable probe platform. In such a case, the alignment unit can be controlled to perform an alignment with an alignment mark on the panel to be tested, prior to controlling a plurality of selected signal access points to access corresponding test signals.

Specifically, the alignment unit firstly collects an offset of the alignment mark on the panel to be tested relative to itself, and then controls the movable probe platform to move based on the offset, so as to enable the alignment unit to be aligned with the alignment mark. After the alignment is finished, a plurality of signal access points are controlled to access corresponding test signals based on the determined type and order of the test signals.

The method 500 as shown in FIG. 5 can further comprise step 502, controlling a plurality of corresponding test probes to contact with the test pads on the panel to be tested, and transmitting the test signals to the test pads, so as to perform an electrical test to the panel to be tested.

In some exemplary embodiments, the controlling a plurality of corresponding test probes to contact with the test pads on the panel to be tested can comprise adjusting a height of the support, so as to enable the test probes to contact with the test pads on the panel to be tested, wherein the support is used for supporting a first frame and a second frame, the first frame is used for bearing the panel to be tested, and the second frame is used for bearing the movable probe platform.

In an embodiment of this disclosure, the plurality of test probes are fixed on the movable probe platform, and each signal access point is correspondingly coupled to one test probe. By controlling the plurality of corresponding test probes to contact with the test pads on the panel to be tested, the test signals accessed by the signal access points are transmitted to the test pads, so as to perform an electrical test to the panel to be tested.

In an embodiment of this disclosure, a plurality of signal access points are controlled to access corresponding test signals, a plurality of corresponding test probes are controlled to contact with the test pads on the panel to be tested, and the test signals are transmitted to the test pads, so as to perform an electrical test to the panel to be tested. corresponding numbers of test probes are selected based on numbers of the test pads on different panels to be tested. When types and orders of the test signals of different panels to be tested are different, an electrical test can be performed to different types of panels to be tested by changing the type and the order of the test signals accessed by a plurality of signal access points of the test device according to an embodiment of this disclosure. The test device and the test method according to an embodiment of this disclosure can perform an electrical test to different types of panels to be tested, without design a dedicated test device for each type of test panels. Therefore, the cost of the process flow is reduced.

Regarding the preceding method embodiments, for the sake of simple description, they are all expressed as combinations of a series of actions. However, the skilled person in the art should learn that this disclosure is not limited by the described order of the actions, because according to this disclosure, some steps can be performed in other orders or simultaneously. Secondly, the skilled person in the art should also learn that all of the embodiments described in the Specification belong to preferred embodiments. The involved actions and modules are not necessarily required by this disclosure.

The embodiments in this Specification are all described in a progressive way, each embodiment stresses differences from other embodiments, and the same or similar parts between the embodiments can make reference to each other.

Finally, it is also noted that in this document, relationship terms such as first and second are only used for distinguishing one entity or operation from another entity or operation, but not necessarily requiring or implying presence of any such actual relationship or order between these entities or operations. Moreover, terms "comprise", "include" or any other variants thereof are intended to cover nonexclusive inclusion, thereby enabling the process, method, commodity or device that includes a series of elements not only to include those elements but also to include other elements not listed explicitly, or to include elements inherent for the process, method, commodity or device. In the case of no more limitations, an element defined by the sentence "including a . . . " does not exclude presence of another same element in the process, method, commodity or device that includes the element.

The test device and the test method provided by this disclosure have been introduced above in detail. Specific examples are applied in this document to set forth the principles and implementations of this disclosure. The explanations of the above embodiments are only used to facilitate understanding of the methods of this disclosure and the core concept thereof. Meanwhile, for the ordinary skilled person in the art, modifications could be made to both the specific implementations and the application scopes according to the concept of this disclosure. To sum up, contents of this Specification should not be interpreted as limitations to this disclosure.

The invention claimed is:

1. A test device comprising: a movable probe platform, a plurality of signal access points, and a plurality of test probes fixed on the movable probe platform, wherein
    each of the plurality of the signal access points is correspondingly coupled to one test probe for accessing a corresponding test signal; and
    the plurality of the test probes are configured to contact with test pads on a panel to be tested, and to transmit test signals accessed from the plurality of the signal access points to the test pads, so as to perform an electrical test to the panel to be tested;
    wherein the plurality of the test probes are scalable test probes comprising a housing, a probe head, and an elastic component for changing a relative position of the housing and the probe head,
    wherein the elastic component comprises a control unit, and a spring coupled to one end of the control unit, the spring is arranged at a side of the probe head away from the panel to be tested, and the control unit is arranged at a side of the spring away from the probe head and wherein
    when the spring is deformed by a pressure of the control unit, the control unit controls the probe head to protrude from the housing and to contact with a test pad on the panel to be tested, and
    when the pressure is revoked, the spring recovers to an initial state, and the control unit controls the probe head to retract into the housing.

2. The test device according to claim 1, further comprising a first frame, a second frame, and a support for supporting the first frame and the second frame; the first frame being used for bearing the panel to be tested, and the second frame being used for bearing the movable probe platform.

3. The test device according to claim 2, wherein the support is a support with an adjustable height.

4. The test device according to claim 1, wherein the plurality of the test probes are double row test probes in an equidistant arrangement.

5. The test device according to claim 1, wherein a number of the plurality of the test probes is greater than or equal to 15.

6. The test device according to claim 1, wherein a size of the probe head is smaller than a size of the test pad.

7. The test device according to claim 1, further comprising an alignment unit fixed on the movable probe platform for performing an alignment with an alignment mark on the panel to be tested.

8. The test device according to claim 7, wherein the alignment unit is a CCD alignment camera.

9. The test device according to claim 1, wherein types, orders or number of the test signals accessed from the plurality of signal access points varies as the panel to be tested varies.

10. A test method comprising:
controlling a plurality of signal access points to access corresponding test signals; and
controlling a plurality of corresponding test probes to contact with test pads on a panel to be tested, transmitting the test signals to the test pads, so as to perform an electrical test to the panel to be tested;
wherein the plurality of test probes are fixed on a movable probe platform, and each of the plurality of signal access points is correspondingly coupled to one test probe, and
wherein the controlling the plurality of signal access points to access corresponding test signals comprises:
selecting a corresponding number of signal access points based on a number of test pads on the panel to be tested,
determining a type and an order of test signals accessed from the corresponding number of the signal access points based on a type and an order of test signals required by the panel to be tested, and
controlling the corresponding number of the selected signal access points to access corresponding test signals based on the determined type and order of the test signals.

11. The test method according to claim 10, further comprises: prior to the controlling the plurality of signal access points to access corresponding test signals,
controlling an alignment unit to perform an alignment with an alignment mark on the panel to be tested, wherein the alignment unit is fixed on the movable probe platform.

12. The test method according to claim 10, wherein the controlling a plurality of corresponding test probes to contact with test pads on a panel to be tested comprises adjusting a height of a support, so as to enable the plurality of the corresponding test probes to be contact with the test pads on the panel to be tested, wherein the support is used for supporting a first frame and a second frame, the first frame is used for bearing the panel to be tested, and the second frame is used for bearing the movable probe platform.

13. The test method according to claim 10, wherein types, orders or number of the test signals accessed from the plurality of signal access points varies as the panel to be tested varies.

* * * * *